United States Patent
Aoki

(10) Patent No.: US 8,493,254 B2
(45) Date of Patent: Jul. 23, 2013

(54) AD CONVERTER AND AD CONVERTER CIRCUIT VOLTAGE CONTROL METHOD

(75) Inventor: Yasunori Aoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 65 days.

(21) Appl. No.: 13/211,782

(22) Filed: Aug. 17, 2011

(65) Prior Publication Data
US 2012/0050087 A1 Mar. 1, 2012

(30) Foreign Application Priority Data
Aug. 24, 2010 (JP) ................ P2010-187371

(51) Int. Cl.
*H03M 1/88* (2006.01)
(52) U.S. Cl.
USPC .......................................... 341/139; 341/155
(58) Field of Classification Search
USPC .................. 341/155, 142, 120, 118, 139
See application file for complete search history.

(56) References Cited

U.S. PATENT DOCUMENTS

| | | | |
|---|---|---|---|
| 5,748,129 A | 5/1998 | Tsumura | |
| 6,549,574 B1* | 4/2003 | De Bart et al. | 375/240.05 |
| 6,657,570 B1* | 12/2003 | Chiappetta | 341/120 |
| 7,956,933 B2* | 6/2011 | Ohiwa | 348/725 |

FOREIGN PATENT DOCUMENTS

| | | |
|---|---|---|
| JP | 64-37121 | 2/1989 |
| JP | 7-50583 | 2/1995 |
| JP | 8-154106 | 6/1996 |
| JP | 9-116435 | 5/1997 |

* cited by examiner

*Primary Examiner* — Peguy Jean Pierre
(74) *Attorney, Agent, or Firm* — Finnegan, Henderson, Farabow, Garrett & Dunner, L.L.P.

(57) ABSTRACT

There is provided an AD converter including an AGC circuit that changes an input amplitude of an analog signal and outputs the analog signal to an AD converter circuit that converts the analog signal to a digital signal, and a first detection portion that compares an output range of the analog signal output by the AGC circuit with a predetermined voltage range and, based on a comparison result, controls the output range of the analog signal output by the AGC circuit.

8 Claims, 11 Drawing Sheets

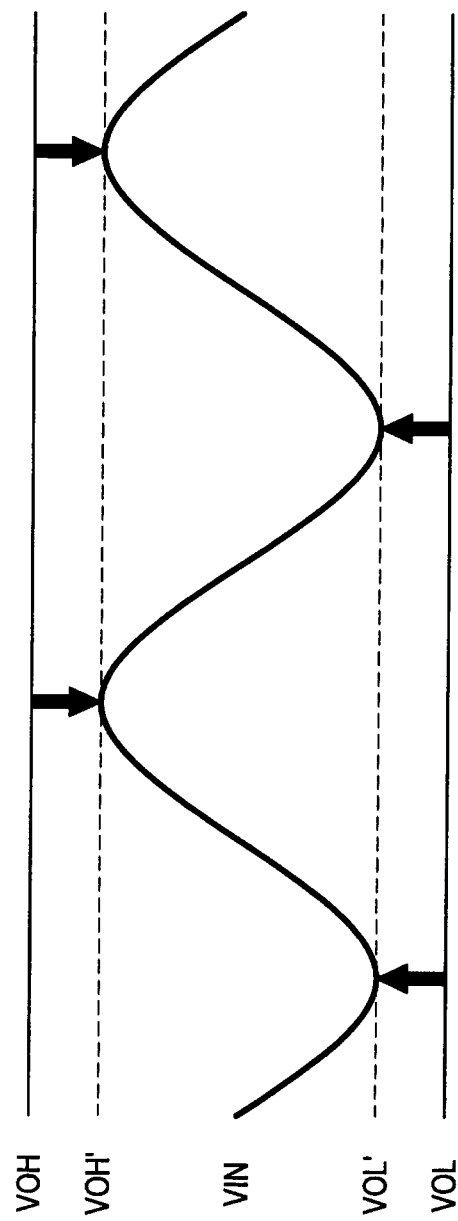

AD CONVERTER AND AD CONVERTER CIRCUIT VOLTAGE CONTROL METHOD

BACKGROUND

The present disclosure relates to an AD converter and an AD converter circuit voltage control method.

When an AD converter circuit is used to perform digital signal processing, it is extremely important to accurately convert an input analog signal to a digital signal, in terms of signal processing following the converter circuit. Normally therefore, an auto gain control (AGC) circuit is disposed at a stage before the AD converter circuit. By doing this, waveform information is not lost and resolution is also not lost. Thus an amplitude level of the analog signal is automatically controlled and an amplitude range of the analog input signal is set to approximately match a dynamic range.

Further, an AD converter circuit (flash type) that is used for reception processing in a high speed wireless communication device divides up a reference voltage into many steps and compares each of the divided voltages, respectively, with an analog input voltage. At the same time, the AD converter circuit encodes results of the comparisons as binary coded digital values. At that time, an analog input dynamic range of the above-described AD converter circuit is determined by the reference voltages. In particular, when broadcast or communication related signal processing is performed, loss can be assumed on a transmission path, and it is therefore essential to keep the analog signal level within a constant range.

Here, as one method to automatically control the amplitude level of the analog signal, technology exists in which difference data (which is obtained by comparing an amplitude value of a signal extracted from a digital output of an AD converter circuit with a predetermined set value) is used to variably set reference voltages that determine the analog input dynamic range of the AD converter circuit (refer to Japanese Patent Application Publication No. JP-A-1-37121 and Japanese Patent Application Publication No. JP-A-09-116435).

By using this technology, the dynamic range of the analog input signal can be caused to match a voltage difference (VOH–VOL) between reference voltages, and a structure is obtained in which a quantization resolution of the AD converter circuit can constantly be utilized to the maximum. Further, as it is not necessary to perform gain control on the analog input signal, an auto gain control (AGC) circuit is not required.

SUMMARY

As the reference voltages are adjusted in the above-described technology, a width of the quantization resolution (1 LSB) varies, and thus operation restrictions on the AD converter circuit become more stringent. In addition, in order to use the digital output, it is necessary to convert from digital to analog using pulse width modulation (PWM), to smooth the output using a low-pass filter to obtain a gain control signal GCNT, and to provide a path to feed back the GCNT signal to the input side. A further disadvantage is that an excess amount of time is required to cause the analog signal to pass through the AD converter circuit and cause the analog input to converge. Similar technology to the technology described hereinabove (technology in which the reference voltages are adjusted and matched) is described in, for example, Japanese Patent Application Publication No. JP-A-7-50583.

When ultrafine processing is used, in particular, an influence of relative variations between each transistor and resistive element etc. causes the converging time of the analog input to become saliently clear, and design is normally carried out such that restriction conditions on the quantization resolution width are as relaxed as possible.

Further, a similar technology is known in which, after amplification by the AGC circuit to a certain level, the reference voltages are adjusted and matched by changing them to the analog input amplitude (refer to Japanese Patent Application Publication No. JP-A-8-154106, for example). By using this technology, it is possible to keep the width of the quantization resolution (1 LSB) within the operation restriction conditions of the AD converter circuit, thus overcoming the problems of the above-described technology in which the reference voltages are adjusted and matched.

However, in the technology in which, after amplification by the AGC circuit to a certain level, the reference voltages are adjusted and matched by changing them to the analog input amplitude, a two-stage adjustment sequence (a step in which the analog input amplitude is adjusted to a reference level in the AGC circuit, and after that, a step in which the reference voltages are adjusted and matched to the input amplitude that has become the reference level) is required. As a result, an unnecessary amount of time is taken to converge an operation status. This is a particular disadvantage when convergence time restrictions are stringent in switching between transmission and reception operations in high-speed wireless communication.

In light of the foregoing, it is desirable to provide a novel and improved AD converter and AD converter circuit voltage control method that are capable of reducing convergence time of an analog input amplitude during AD conversion and of utilizing an assumed quantization resolution of the AD converter circuit to a maximum extent.

According to an embodiment of the present disclosure, there is provided an AD converter including an AGC circuit that changes an input amplitude of an analog signal and outputs the analog signal to an AD converter circuit that converts the analog signal to a digital signal, and a first detection portion that compares an output range of the analog signal output by the AGC circuit with a predetermined voltage range and, based on a comparison result, controls the output range of the analog signal output by the AGC circuit.

The first detection portion may compare the output range of the analog signal output by the AGC circuit with reference voltages of the AD converter circuit and, based on a comparison result, may control the output range of the analog signal output by the AGC circuit.

During a period of time in which the output range of the analog signal output by the AGC circuit exceeds a range of the reference voltages, the first detection portion may output a signal that indicates that the output of the AGC circuit exceeds the range of the reference voltages of the AD converter circuit.

The signal output by the first detection portion may be a pulse.

The AD converter may further include a second detection portion that, from the output of the AGC circuit, controls the output range of the analog signal output by the AGC circuit such that the output range of the analog signal is a selected range.

The AD converter may further include a performance comparison portion that compares an AD conversion performance of the AD converter circuit obtained using the first detection portion with an AD conversion performance of the AD converter circuit obtained using the second detection portion. Of wave detection by the first detection portion and wave detection by the second detection portion, the performance comparison portion may select the wave detection for which the AD conversion performance of the AD converter circuit is superior.

The AD converter may further include a performance comparison portion that compares an AD conversion performance of the AD converter circuit obtained using the first detection portion, an AD conversion performance of the AD converter circuit obtained using the second detection portion, and an AD conversion performance of the AD converter circuit obtained using the first detection portion and the second detection portion. Of wave detection by the first detection portion, wave detection by the second detection portion and wave detection by the first detection portion and the second detection portion, the performance comparison portion may select the wave detection for which the AD conversion performance of the AD converter circuit is superior.

The AD converter may further include a reference voltage adjustment portion that changes the reference voltages of the AD converter circuit.

The AD converter circuit may be a flash AD converter circuit.

According to another embodiment of the present disclosure, there is provided an AD converter circuit voltage control method, including performing gain control, by changing an input amplitude of an analog signal and outputting the analog signal to an AD converter circuit that converts the analog signal to a digital signal, and performing wave detection, by comparing an output range of the analog signal output in performing the gain control with a predetermined voltage range and, based on a comparison result, controlling the output range of the analog signal output in performing the gain control.

According to the present disclosure described above, a novel and improved AD converter and AD converter circuit voltage control method are provided that are capable of reducing convergence time of an analog input amplitude during AD conversion and of utilizing an assumed quantization resolution of the AD converter circuit to a maximum extent.

BRIEF DESCRIPTION OF THE DRAWINGS

FIG. 11 is an explanatory diagram showing a manner in which reference voltages of the AD converter circuit are caused to be changed.

DETAILED DESCRIPTION OF THE EMBODIMENT(S)

Figure 1:
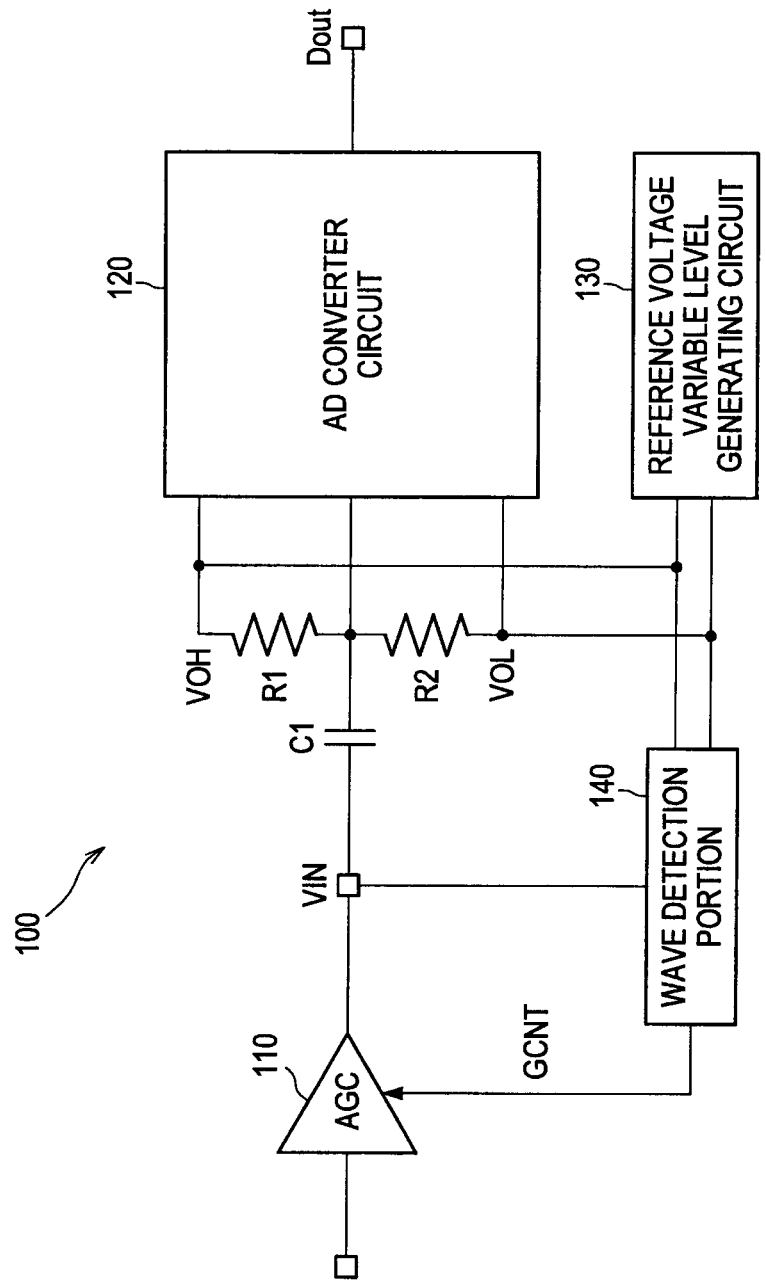
FIG. 1 is an explanatory diagram showing an AD converter 100 according to an embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be given in the following order.

1. Problems of known technology
2. Embodiment of present disclosure
2-1. Configuration example of AD converter
2-2. Operations of AD converter
2-3. Modified example of AD converter
3. Conclusion

1. PROBLEMS OF KNOWN TECHNOLOGY

Figure 10:
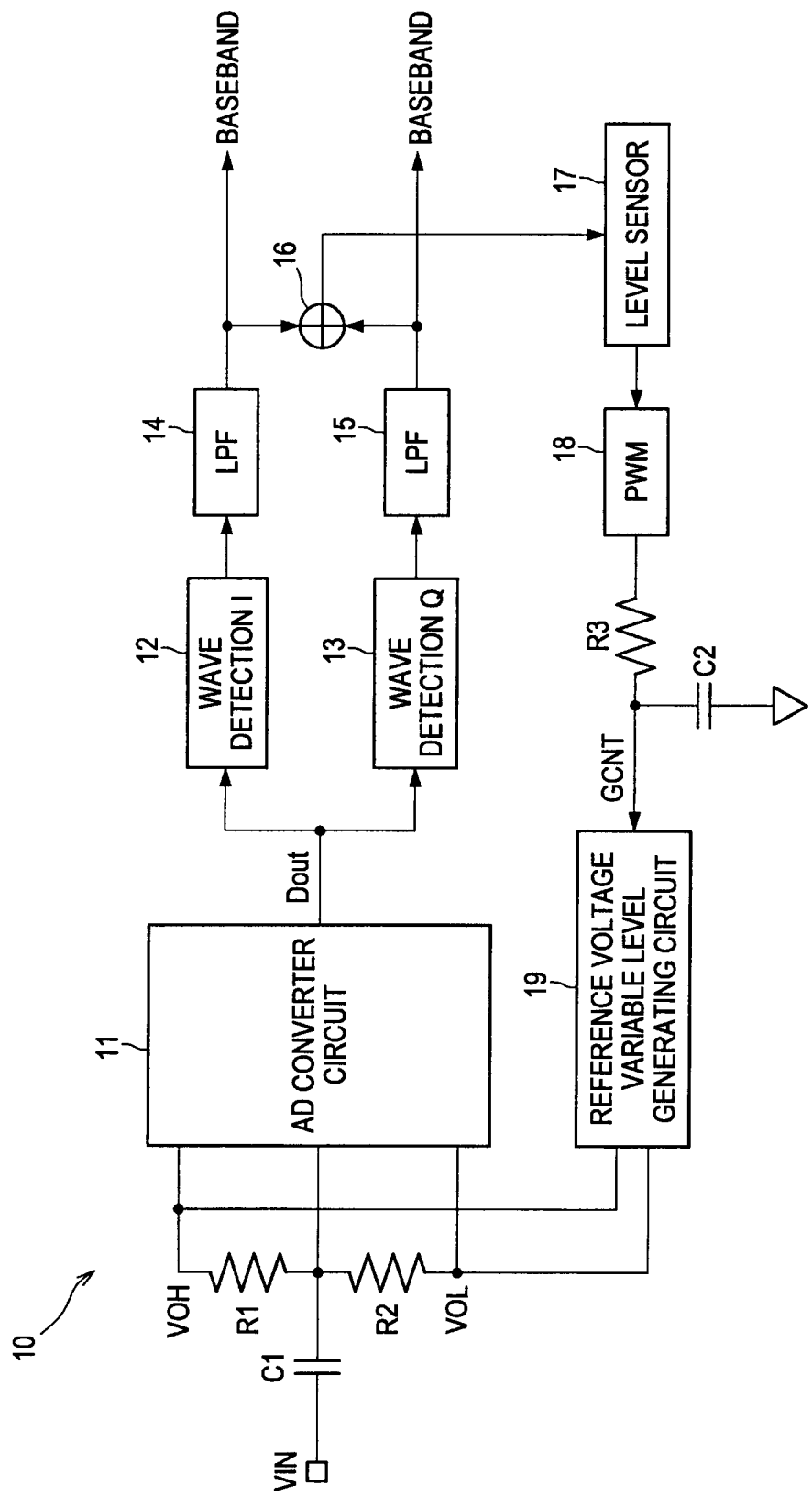
FIG. 10 is an explanatory diagram showing a configuration example of a digital demodulator circuit 10 provided with a known AD converter circuit.

First, an explanation will be given of known technology and problems related with the known technology. FIG. 10 is an explanatory diagram showing a configuration example of a digital demodulator circuit 10 provided with a known AD converter circuit. FIG. 10 shows the structure of the digital demodulator circuit 10 that adopts a technology in which reference voltages that determine an analog input dynamic range are set to be variable, using difference data that is obtained by comparing an amplitude value of a signal extracted from a digital output with a predetermined set value.

As shown in FIG. 10, the digital demodulator circuit 10 includes an AD converter circuit 11, detection circuits 12 and 13, an LPF 14 and an LPF 15, an adder circuit 16, a level sensor 17, a PWM generator 18 and a reference voltage variable level generating circuit 19.

The AD converter circuit 11 converts an analog input signal to a digital input signal and outputs the digital signal, and is a flash AD converter circuit. The AD converter circuit 11, for example, performs AD conversion on the analog input signal that has been modulated using a predetermined modulation scheme (QPSK modulation, for example) and outputs the AD converted signal.

The detection circuit 12 performs detection processing with respect to the AD converter circuit 11, and outputs an I channel base band signal. Similarly, the detection circuit 13 performs detection processing with respect to the AD converter circuit 11 and outputs a Q channel base band signal. The LPF 14 and the LPF 15 perform filtering on the detection circuits 12 and 13 respectively. The adder circuit 16 adds outputs of the LPF 14 and the LPF 15 and outputs the added value to the level sensor 17.

The level sensor 17 receives the output from the adder circuit 16 and monitors a signal level of the base band signals. The level sensor 17 outputs a result of monitoring the base band signal levels to the PWM generator 18.

The PWM generator 18 performs DA conversion on the monitoring result of the base band signal levels received from the level sensor 17 and outputs the DA converted signal. The output of the PWM generator 18 is smoothed by a low pass filter formed of a resistor R3 and a capacitor C2, and is transmitted to the reference voltage variable level generating circuit 19 as a gain control signal GCNT.

The reference voltage variable level generating circuit 19 receives the gain control signal GCNT supplied from the PWM generator 18 and the low pass filter and uses the gain control signal GCNT to control the reference voltages of the AD converter circuit 11. A method to control the reference voltages of the AD converter circuit 11 using the gain control signal GCNT is, for example, a method to control the reference voltages of the AD converter circuit 11 using a variable resistor in which a resistance value changes in accordance with the gain control signal GCNT.

As described above, by using this technology, as the analog input dynamic range matches a voltage difference (VOH−VOL) between the reference voltages, a structure is obtained in which the quantization resolution of the AD converter circuit can be constantly utilized to a maximum extent. Furthermore, it is not necessary to perform gain control for the analog input signal and thus an auto gain control (AGC) circuit is not required.

However, in this known technology, the reference voltages VOH and VOL of the AD converter circuit are adjusted, as shown in FIG. 11. The amplitude of an analog input signal VIN that is input to the AD converter circuit 11 is matched to the reference voltages by adjusting the reference voltages VOH and VOL to reference voltages VOH' and VOL'. In this way, a width of the quantization resolution (1 LSB) of the AD converter circuit 11 varies and thus operation restrictions on the AD converter circuit become stringent.

In addition, in order to use the digital output, it is necessary to convert from digital to analog using pulse width modulation (PWM), to smooth the output using a low-pass filter to obtain a gain control signal GCNT, and to provide a path to feed back the GCNT signal to the input side. A further disadvantage is that an excess amount of time is required to cause the analog signal to pass through the AD converter circuit and cause the analog signal to converge.

Here, in the AD converter according to the embodiment of the present disclosure which will be described hereinafter, the reference voltages VOH and VOL are not first adjusted, but the amplitude of the analog input signal is adjusted. In this way, convergence time of the analog input amplitude is reduced, and the assumed quantization resolution of the AD converter circuit can be utilized to the maximum extent.

2. EMBODIMENT OF PRESENT DISCLOSURE

2.1 Configuration Example of AD Converter

Next, a configuration example of an AD converter according to the embodiment of the present disclosure will be explained. FIG. 1 is an explanatory diagram showing an AD converter 100 according to the embodiment of the present disclosure. Hereinafter, the configuration of the AD converter 100 according to the embodiment of the present disclosure will be explained with reference to FIG. 1.

As shown in FIG. 1, the AD converter 100 according to the embodiment of the present disclosure includes an AGC circuit 110, an AD converter circuit 120, a reference voltage variable level generating circuit 130 and a detection portion 140.

The AGC circuit 110 is a circuit that amplifies the analog input signal by a predetermined amplification factor and outputs the amplified signal. The AGC circuit 110 can change the above-mentioned amplification factor using a gain control signal GCNT supplied from the detection portion 140.

The AD converter circuit 120 is a flash AD converter circuit that converts the analog input signal, which is supplied from the AGC circuit 110 and which has been amplified by the predetermined amplification factor, to a digital signal and outputs the digital signal. The flash AD converter circuit has a plurality of comparators in a parallel arrangement, and simultaneously compares the analog input signal with reference signals, and can thus convert an analog value to a digital value with a one-time comparison. The reference voltages VOH and VOL are supplied to the AD converter circuit 120 from an external source. The AD converter circuit 120 uses the reference voltages VOH and VOL to convert the analog input signal supplied from the AGC circuit 110 to the digital signal, and outputs the digital signal.

Figure 2:
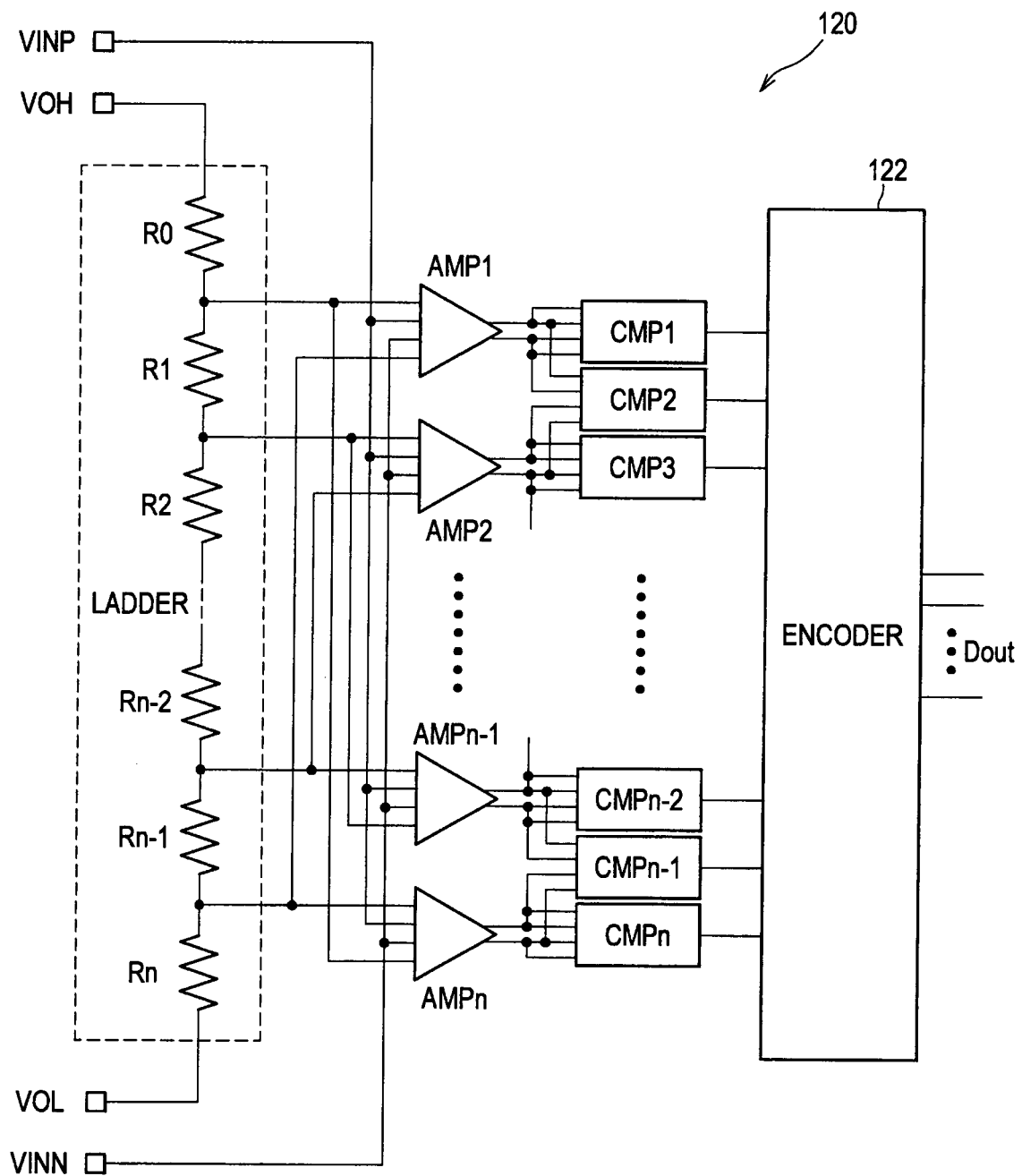
FIG. 2 is an explanatory diagram showing a configuration example of an AD converter circuit 120.

FIG. 2 is an explanatory diagram showing a configuration example of the AD converter circuit 120 that is the flash AD converter circuit. As shown in FIG. 2, the AD converter circuit 120 includes a resistor ladder formed from resistors R0, R1, R2 through to resistors Rn-2, Rn-1 and Rn, amplifiers AMP1, AMP2 through to AMPn-1 and AMPn, comparators CMP1, CMP2, CMP3 through to CMPn-2, CMPn-1 and CMPn, and an encoder 122, which receives a supplied analog signal, converts the analog signal to a digital signal and outputs the digital signal.

By having the above-described configuration, the AD converter circuit 120 can convert the input analog signal to the digital signal and output the digital signal. Of course, it goes without saying that the AD converter circuit 120 is not limited to the AD converter circuit shown in FIG. 2.

The reference voltage variable level generating circuit 130 controls the reference voltages VOH and VOL of the AD converter circuit 120. By changing values of the reference voltages VOH and VOL of the AD converter circuit 120 using the reference voltage variable level generating circuit 130, it is possible to cause a dynamic range of the analog input signal supplied to the AD converter circuit 120 to match a voltage difference (VOH−VOL) between the reference voltages.

The detection portion 140 compares (detects) the amplitude of the analog input signal, which is supplied from the AGC circuit 110 and which has been amplified by the predetermined amplification factor, with the difference between the reference voltages VOH and VOL supplied from the reference voltage variable level generating circuit 130

If, as a result of comparing the amplitude of the analog input signal with the reference voltage difference, the amplitude of the analog input signal is larger, the detection portion 140 outputs a gain control signal GCNT to the AGC circuit 110 to lower the amplification factor. On the other hand, if, as a result of comparing the amplitude of the analog input signal with the reference voltage difference, the amplitude of the analog input signal is smaller, the detection portion 140 does not output anything. In this way, the AGC circuit 110 performs control to raise the amplification factor until the gain control signal GCNT is output from the detection portion 140.

The gain control signal GCNT may be generated, for example, using a pulse that is in a high state when the amplitude of the analog input signal exceeds the reference voltage. By generating this type of pulse, the detection portion 140 can control the gain of the AGC circuit 110 in accordance with a length of the pulse.

Figure 3:
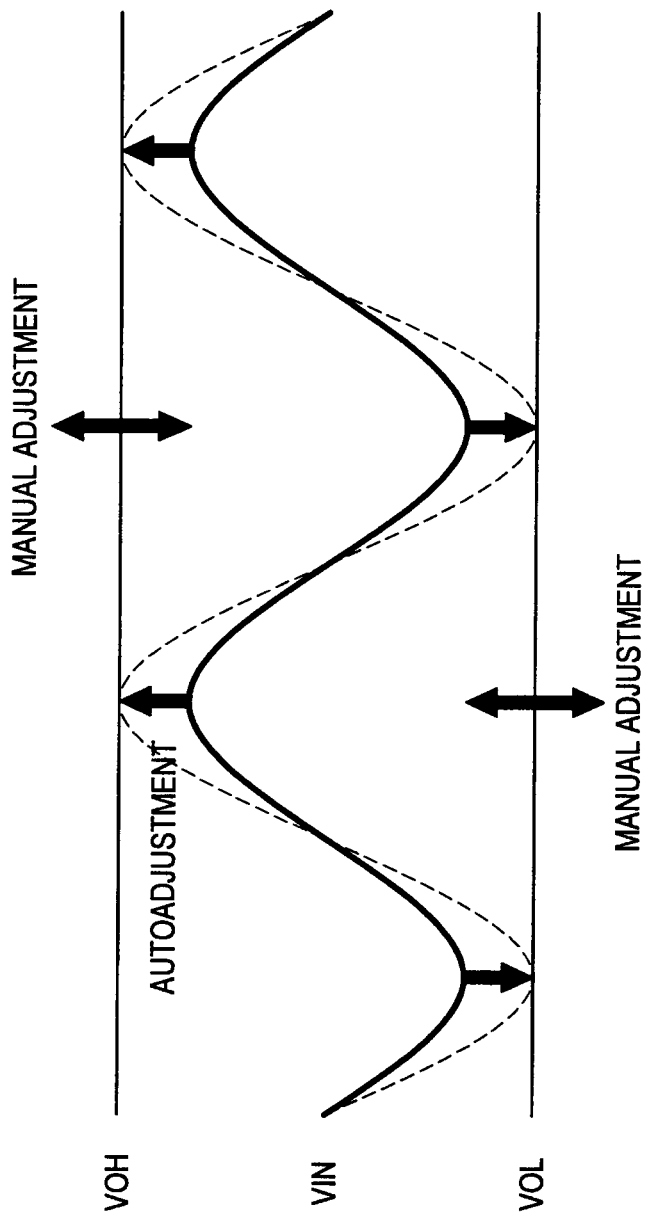
FIG. 3 is an explanatory diagram showing waveforms illustrating circuit operations of the AD converter 100 according to the embodiment of the present disclosure.

FIG. 3 is an explanatory diagram showing waveforms that illustrate circuit operations of the AD converter 100 according to the embodiment of the present disclosure. The AD converter 100 according to the embodiment of the present disclosure is provided with an auto adjustment function that can automatically control the amplitude of the analog input signal VIN, and with a manual adjustment function that controls the reference voltages using the reference voltage variable level generating circuit 130.

By comparing the amplitude of the analog input signal VIN with the voltage difference (VOH−VOL) between the reference voltages, the AD converter 100 according to the embodiment of the present disclosure can cause the dynamic range of the analog input signal supplied to the AD converter circuit 120 to match the voltage difference (VOH−VOL) between the reference voltages without adjusting the reference voltages. In this way, the AD converter 100 according to the embodiment of the present disclosure can utilize the assumed quantization resolution of the AD converter circuit 120 to the maximum extent.

Hereinabove, the configuration of the AD converter 100 according to the embodiment of the present disclosure is explained with reference to FIG. 1. Next, a configuration example of the detection portion 140 included in the AD converter 100 according to the embodiment of the present disclosure will be explained.

Figure 4:
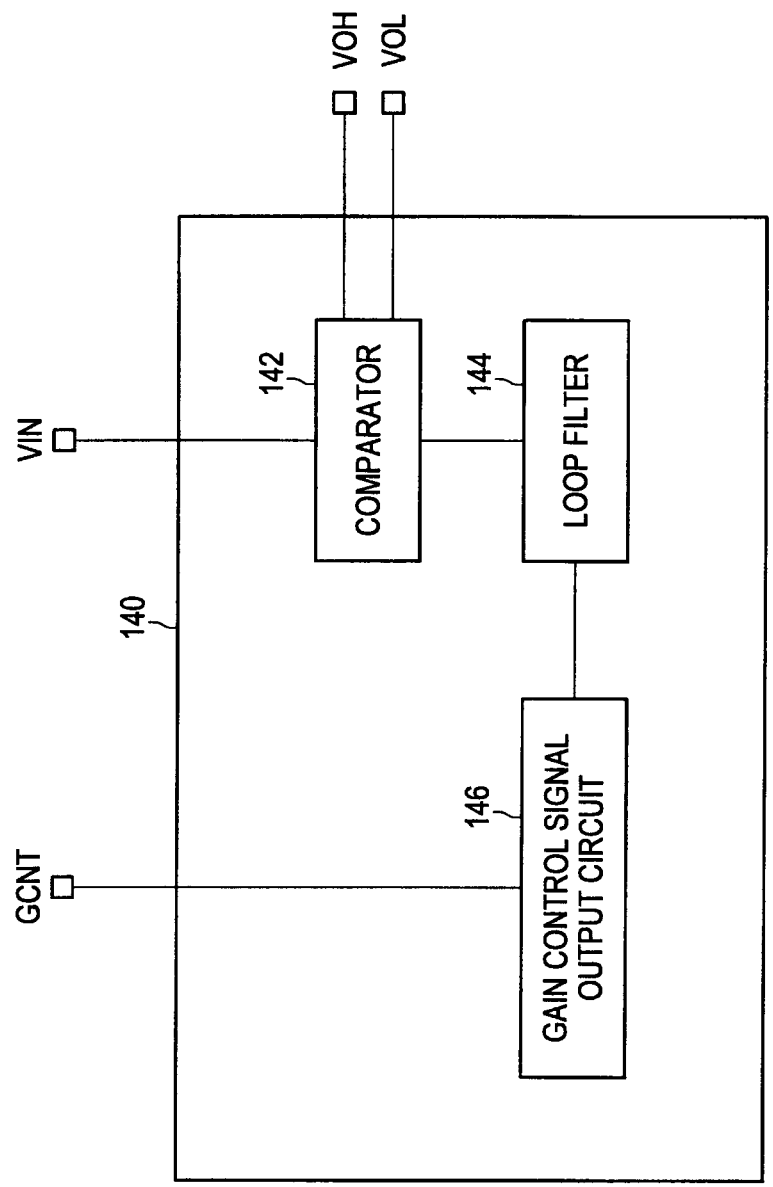
FIG. 4 is an explanatory diagram showing a configuration example of a detection portion 140.

FIG. 4 is an explanatory diagram showing the configuration example of the detection portion 140. Hereinafter, the configuration example of the detection portion 140 will be explained with reference to FIG. 4.

As shown in FIG. 4, the detection portion 140 includes a comparator 142, a loop filter 144 and a gain control signal output circuit 146.

The comparator 142 receives the amplitude of the analog input signal VIN amplified by the AGC circuit 110 and the reference voltages VOH and VOL from the reference voltage variable level generating circuit 130, and compares the amplitude of the analog input signal VIN with the reference voltage difference (VOH−VOL).

If, as a result of the comparison, the amplitude of the analog input signal VIN is larger, during a period in which the amplitude of the analog input signal VIN is larger, the comparator 142 outputs a pulse in a high state to the loop filter 144. On the other hand, if, as a result of the comparison, the amplitude of the analog input signal VIN is smaller, the comparator 142 outputs a pulse that is still in a low state to the loop filter 144.

The loop filter 144 removes AC components from the pulse output by the comparator 142. An output of the loop filter 144 is transmitted to the gain control signal output circuit 146.

The gain control signal output circuit 146 receives the pulse output by the comparator 142 that has passed through the loop filter 144. Then, from the received pulse, the gain control signal output circuit 146 generates and outputs a gain control signal GCNT that controls the amplification factor of the AGC circuit 110. The AGC circuit 110 changes the amplification factor using the gain control signal GCNT output from the gain control signal output circuit 146.

By configuring the detection portion 140 in this manner, the amplitude of the analog input signal can be compared with the difference between the reference voltages and the amplification factor of the AGC circuit 110 can be controlled in accordance with the result of the comparison. Thus, the AD converter 100 according to the embodiment of the present disclosure reduces the convergence time of the analog input amplitude during AD conversion, and, as the reference voltages are not changed, the assumed quantization resolution of the AD converter circuit 120 can be utilized to the maximum extent.

Hereinabove, the configuration example of the detection portion 140 is explained with reference to FIG. 4. Next, operations of the AD converter 100 according to the embodiment of the present disclosure will be explained.

2.2 Operations of AD Converter

Figure 5:
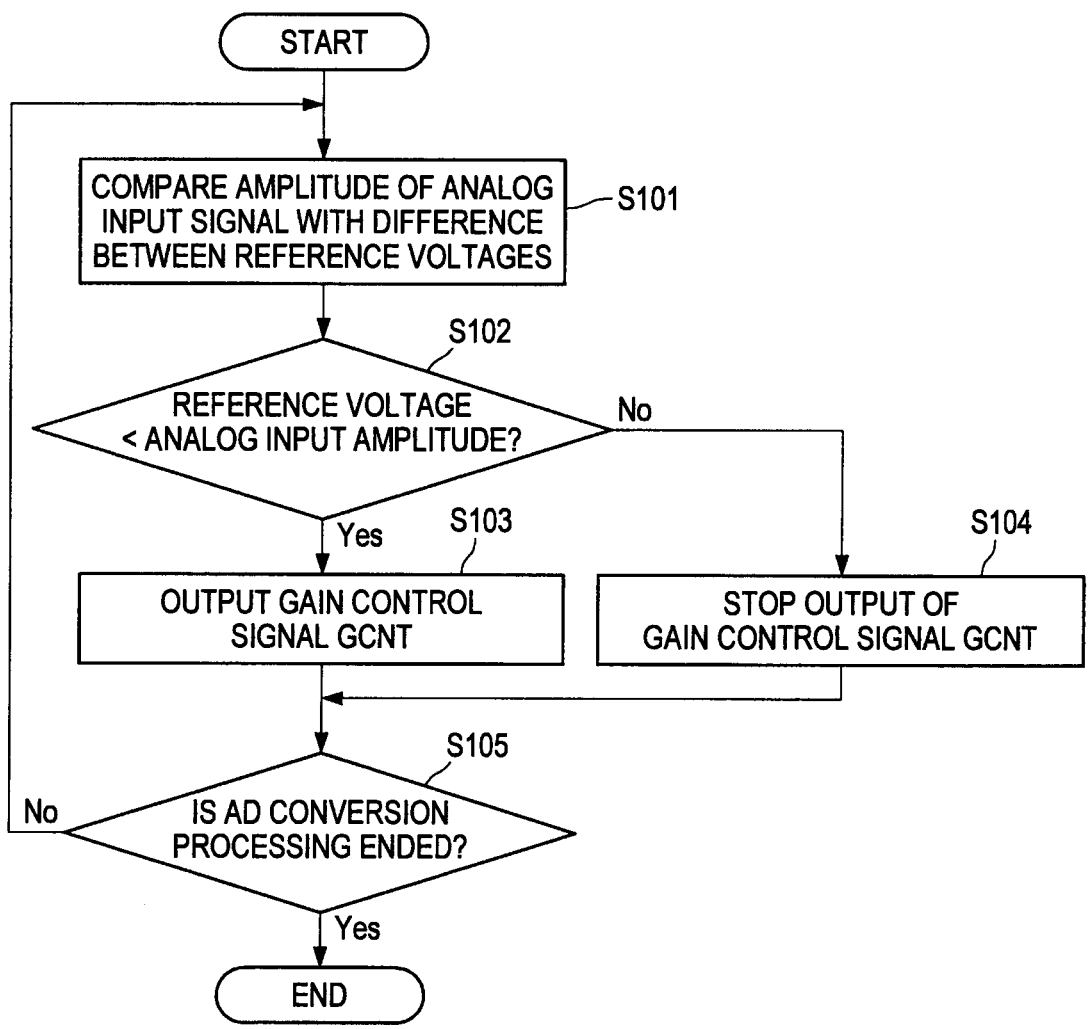
FIG. 5 is a flow chart showing operations of the AD converter 100 according to the embodiment of the present disclosure.

FIG. 5 is a flow chart showing operations of the AD converter 100 according to the embodiment of the present disclosure. Hereinafter, the operations of the AD converter 100 according to the embodiment of the present disclosure will be explained with reference to FIG. 5.

In the AD converter 100 according to the embodiment of the present disclosure, when the analog signal is input, the AGC circuit 110 amplifies the analog input signal. In addition to outputting the amplified analog input signal to the AD converter circuit 120, the AGC circuit 110 outputs the amplified analog input signal to the detection portion 140 also.

The detection portion 140 receives the analog input signal amplified by the AGC circuit 110 and the reference voltages VOH and VOL from the reference voltage variable level generating circuit 130, and then compares the amplitude of the analog input signal with the difference between the reference voltages (step S101). The comparison of the amplitude of the analog input signal with the difference between the reference voltages is performed by the comparator 142 shown in FIG. 4.

In the above-described step S101, when the amplitude of the analog input signal is compared with the difference between the reference voltages, next, the detection portion 140 determines a magnitude relationship between the amplitude of the analog input signal and the difference between the reference voltages (step S102). The magnitude relationship between the amplitude of the analog input signal and the difference between the reference voltages is determined by the comparator 142 shown in FIG. 4.

When a determination result of the above-described step S102 indicates that the amplitude of the analog input signal is larger than the difference between the reference voltages, the detection portion 140 outputs the gain control signal GCNT to lower the amplification factor of the AGC circuit 110 (step S103).

On the other hand, when the determination result of the above-described step S102 indicates that the amplitude of the analog input signal is smaller than the difference between the reference voltages, the detection portion 140 stops the output of the gain control signal GCNT that lowers the amplification factor of the AGC circuit 110 (step S104).

Figure 6:
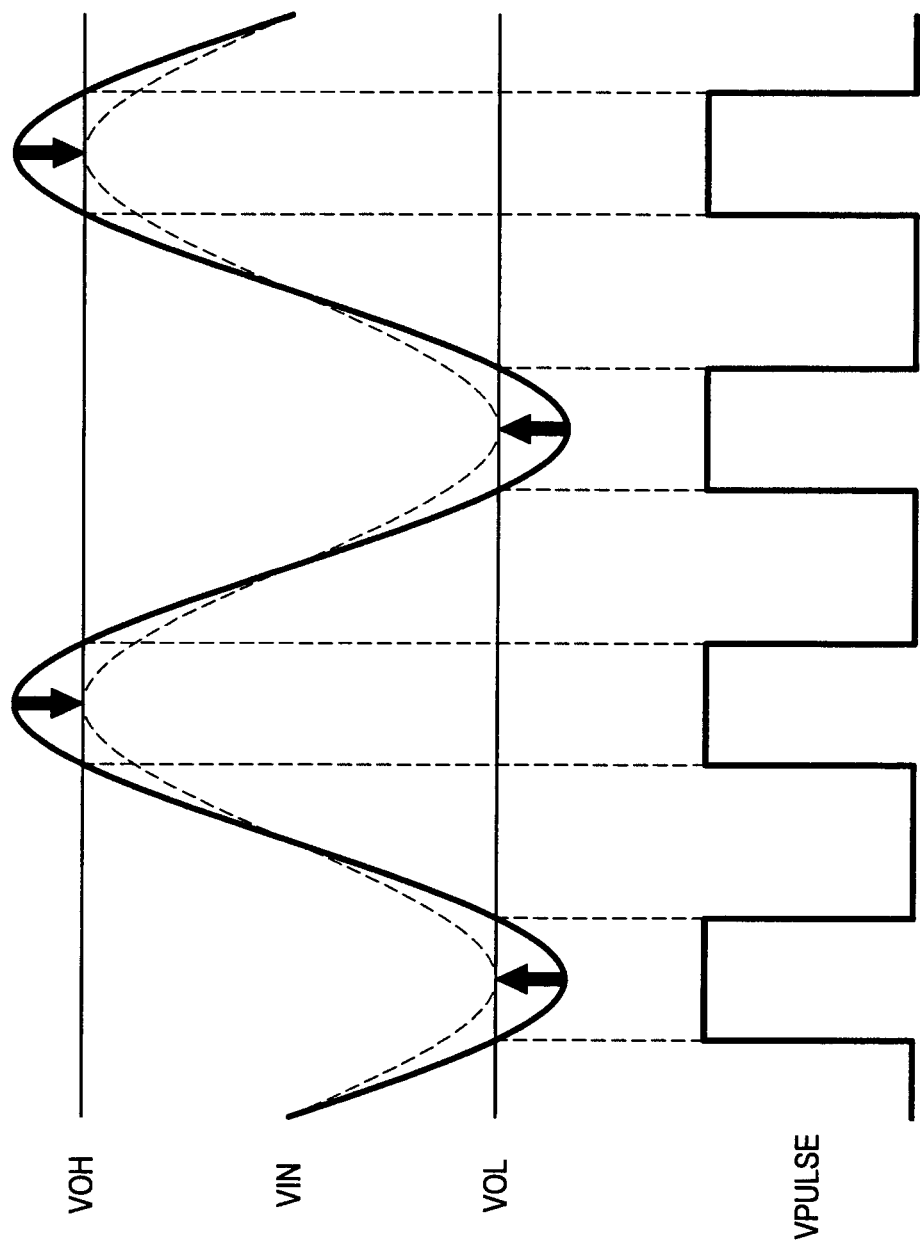
FIG. 6 is an explanatory diagram showing waveforms of an analog input signal VIN, reference voltages VOH and VOL and a pulse VPULSE generated by the detection portion 140, when an analog input signal amplitude is larger than a difference between the reference voltages.
Figure 7:
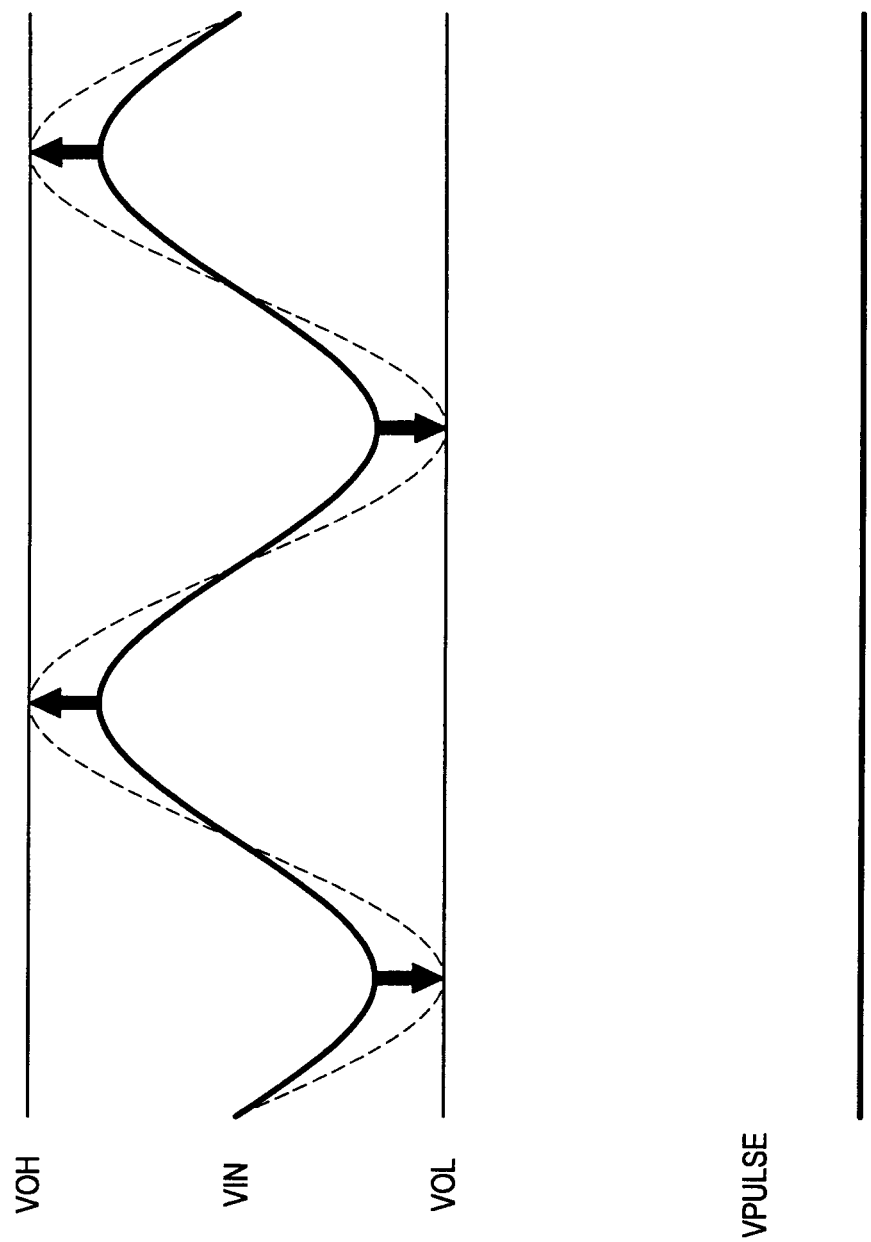
FIG. 7 is an explanatory diagram showing waveforms of the analog input signal VIN, the reference voltages VOH and VOL and the pulse VPULSE generated by the detection portion 140, when the analog input signal amplitude is smaller than the difference between the reference voltages.

FIG. 6 is an explanatory diagram showing waveforms of the analog input signal VIN, the reference voltages VOH and VOL and a pulse VPULSE generated by the detection portion 140, in a case in which the amplitude of the analog input signal is larger than the difference between the reference voltages. Further, FIG. 7 is an explanatory diagram showing waveforms of the analog input signal VIN, the reference voltages VOH and VOL and the pulse VPULSE generated by the detection portion 140, in a case in which the amplitude of the analog input signal is smaller than the difference between the reference voltages.

As shown in FIG. 6, when the amplitude of the analog input signal is larger than the difference between the reference voltages, the detection portion 140 generates the pulse VPULSE in a high state during the period of time in which the amplitude of the analog input signal exceeds the difference between the reference voltages. On the other hand, as shown in FIG. 7, when the amplitude of the analog input signal is smaller than the difference between the reference voltages, the detection portion 140 outputs the pulse VPULSE that is still in a low state.

In this way, by generating the pulse in a high state when the amplitude of the analog input signal exceeds the reference voltage, the detection portion 140 can perform control to lower the gain of the AGC circuit 110 in accordance with the length of the high state pulse. Furthermore, by outputting the pulse that is still in a low state when the amplitude of the analog input signal is smaller than the difference between the reference voltages, the detection portion 140 can perform control to raise the gain of the AGC circuit 110.

Next, the AD converter 100 determines whether or not the AD conversion processing has ended (step S105). If the AD conversion processing is not ended, the processing returns to the above-described step S101, and the comparison of the amplitude of the analog input signal with the difference between the reference voltages is continued. On the other hand, if the AD conversion processing has ended, the operations are ended.

The operations of the AD converter 100 according to the embodiment of the present disclosure are explained above. By performing these types of operation, the AD converter 100 according to the embodiment of the present disclosure can automatically match the amplitude of the analog input signal with the reference voltages, and it is thus possible to reduce the convergence time of the analog input amplitude and the assumed quantization resolution of the AD converter circuit 120 can be utilized to the maximum extent.

2.3 Modified Example of AD Converter

Figure 8:
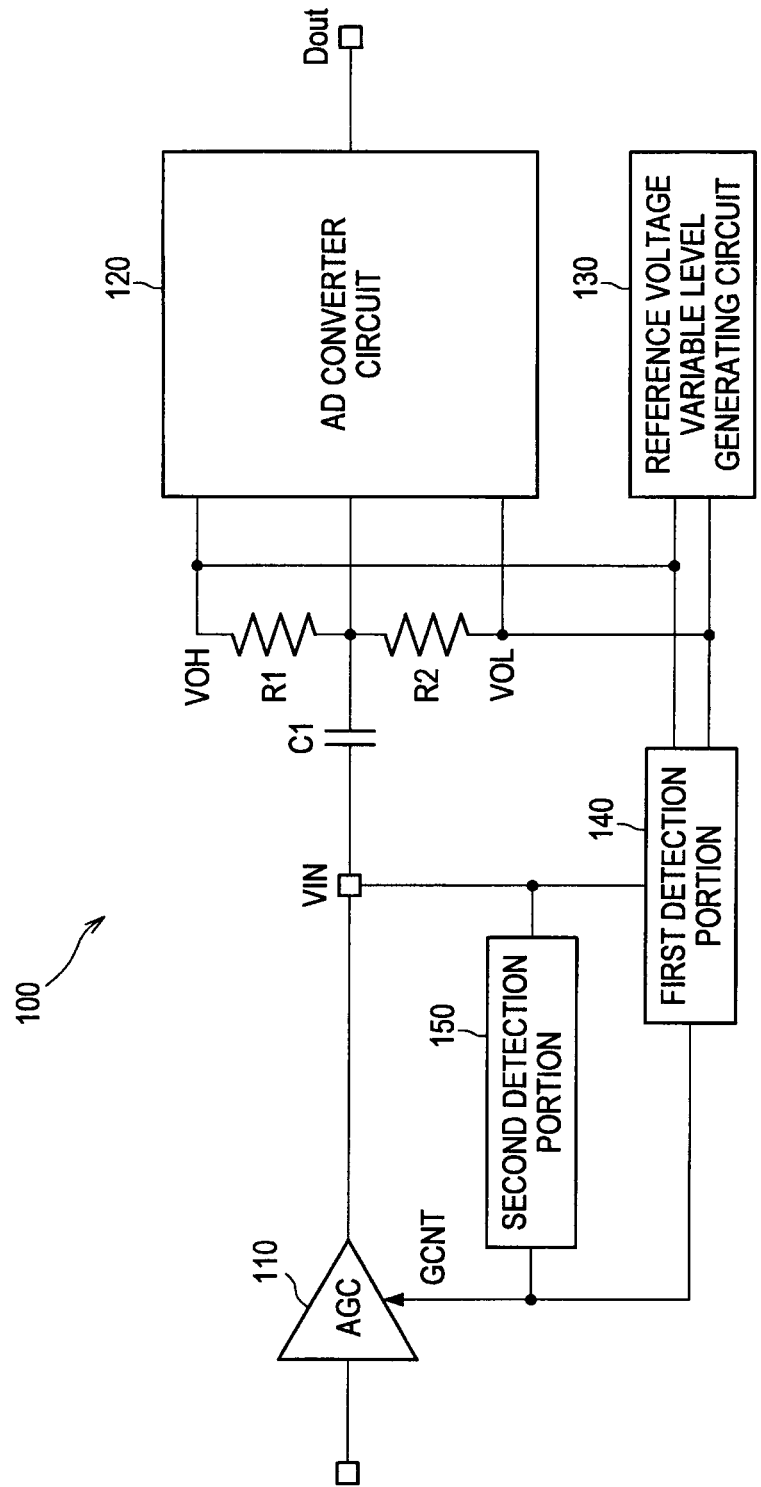
FIG. 8 is an explanatory diagram showing a modified example of the AD converter 100 according to the embodiment of the present disclosure.

Next, a modified example of the AD converter 100 according to the embodiment of the present disclosure will be explained. FIG. 8 is an explanatory diagram showing a configuration of the modified example of the AD converter 100 according to the embodiment of the present disclosure. Hereinafter, the modified example of the AD converter 100 according to the embodiment of the present disclosure will be explained with reference to FIG. 8.

When compared with the AD converter 100 shown in FIG. 1, in the AD converter 100 shown in FIG. 8, the detection portion 140 becomes the first detection portion 140 and further, a second detection portion 150 is newly added.

The first detection portion 140 has the same configuration and functions as the above-described detection portion 140. On the other hand, the second detection portion 150 does not compare the difference between the reference voltages VOH and VOL, but compares a chosen amplitude (which is set in advance) with the output of the AGC circuit 110, and outputs a gain control signal GCNT to control the amplification factor of the AGC circuit 110 so that the chosen amplitude can be obtained.

In this way, as the AD converter 100 shown in FIG. 8 is provided with the two detection portions, the AD converter 100 shown in FIG. 8 performs a comparison with not only the difference between the reference voltages VOH and VOL but also with the chosen amplitude that is set in advance, and thus feedback of higher accuracy is possible, compared to a case in which a comparison is made with the difference between the reference voltages VOH and VOL only. Then, being provided with the two detection portions and by performing the comparison with not only the difference between the reference voltages VOH and VOL but also with the chosen amplitude that is set in advance, the AD converter 100 shown in FIG. 8 can automatically match the amplitude of the analog input signal to the chosen amplitude, reduce the convergence time of the analog input amplitude, and the assumed quantization resolution of the AD converter circuit can be utilized to the maximum extent.

Note that, similarly to the above-described detection portion 140, the second detection portion 150 may have a structure in which a pulse is generated in a high state during a period of time in which the chosen amplitude set in advance is exceeded, and the gain control signal GCNT is generated in accordance with the pulse.

Figure 9:
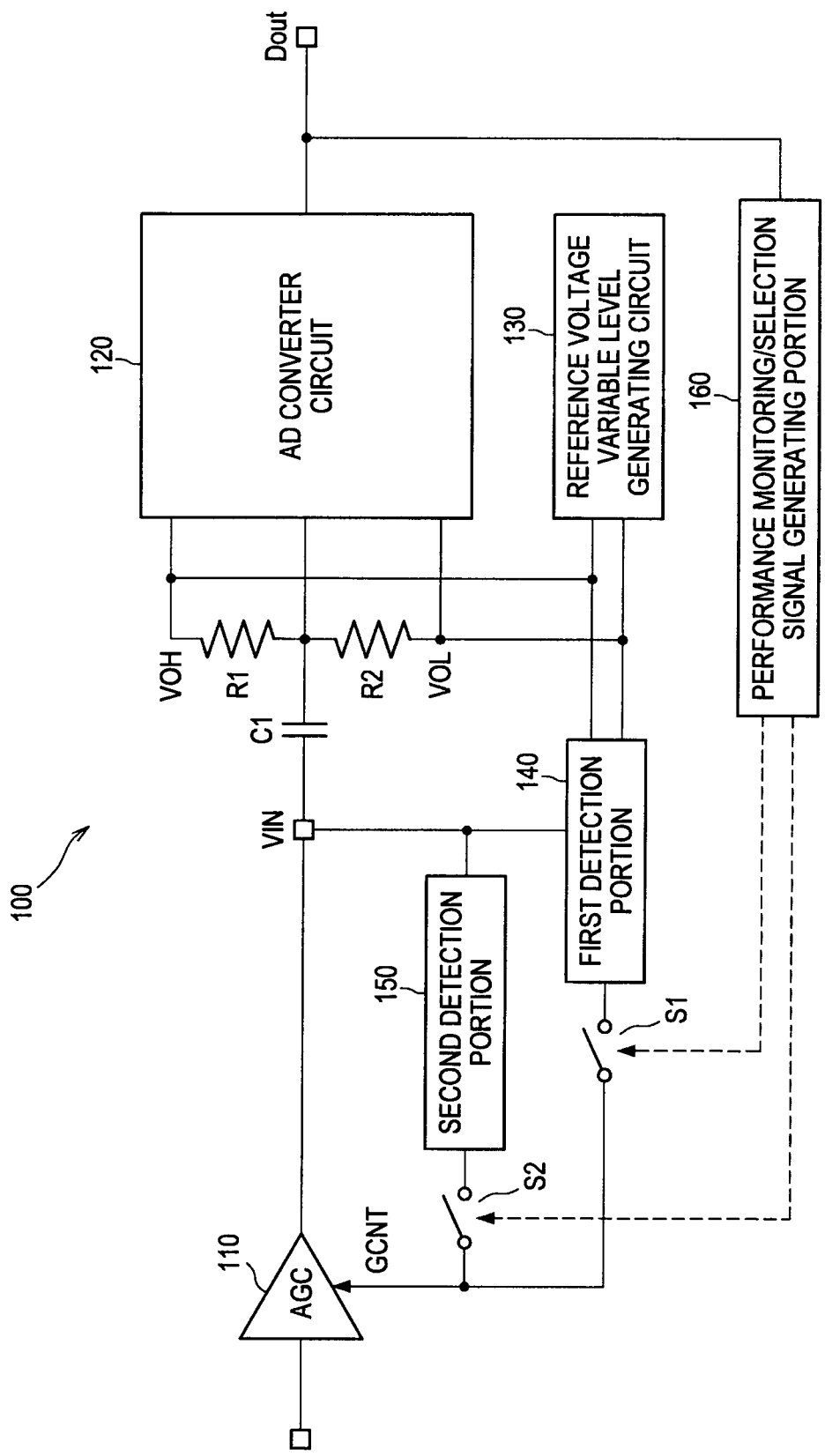
FIG. 9 is an explanatory diagram showing a modified example of the AD converter 100 according to the embodiment of the present disclosure.

FIG. 9 is an explanatory diagram showing a structure of another modified example of the AD converter 100 according to the embodiment of the present disclosure. Hereinafter, the other modified example of the AD converter 100 according to the embodiment of the present disclosure will be explained with reference to FIG. 9.

Compared to the AD converter 100 shown in FIG. 8, the AD converter 100 shown in FIG. 9 has a structure in which a performance monitoring/selection signal generating portion 160 and switches S1 and S2 are newly added.

The performance monitoring/selection signal generating portion 160 receives an output Dout of the AD converter circuit 120, and monitors an AD conversion performance of the output Dout of the AD converter circuit 120. An S/N ratio of the output Dout of the AD converter circuit 120 may be acquired as the AD conversion performance, for example. In accordance with a result of monitoring the AD conversion performance of the output Dout of the AD converter circuit 120, the performance monitoring/selection signal generating portion 160 then generates and outputs a selection signal that is used to determine which to select of wave detection by the first detection portion 140 or by the second detection portion 150.

The selection signal that is output by the performance monitoring/selection signal generating portion 160 is a signal to switch the switches S1 and S2 between on and off. Each of the switches 51 and S2 may be a MOSFET, for example.

The processing to monitor the AD conversion performance of the output Dout of the AD converter circuit 120 by the performance monitoring/selection signal generating portion 160 may be performed in the following manner, for example.

First, by switching the switch 51 on and the switch S2 off, the AD converter 100 shown in FIG. 9 uses the AD converter circuit 120 to AD convert an analog input signal on which gain control has been performed in accordance with a detection result by the first detection portion 140, and a result of the AD conversion is temporarily stored in the performance monitoring/selection signal generating portion 160. For example, the performance monitoring/selection signal generating portion 160 temporarily stores the S/N ratio of the output Dout of the AD converter circuit 120 into which has been input the analog input signal on which gain control has been performed in accordance with the detection result by the first detection portion 140.

Next, by switching the switch S1 off and the switch S2 on, the AD converter 100 shown in FIG. 9 uses the AD converter circuit 120 to AD convert an analog input signal on which gain control has been performed in accordance with a detection result by the second detection portion 150, and a result of the AD conversion is temporarily stored in the performance monitoring/selection signal generating portion 160. For example, the performance monitoring/selection signal generating portion 160 temporarily stores the S/N ratio of the output Dout of the AD converter circuit 120 into which has been input the analog input signal on which gain control has been performed in accordance with the detection result by the second detection portion 150.

Further, by switching both the switches S1 and S2 on, the AD converter 100 shown in FIG. 9 uses the AD converter circuit 120 to AD convert an analog input signal on which gain control has been performed in accordance with detection results by the first detection portion 140 and the second detection portion 150, and a result of the AD conversion is temporarily stored in the performance monitoring/selection signal generating portion 160. For example, the performance monitoring/selection signal generating portion 160 temporarily stores the S/N ratio of the output Dout of the AD converter circuit 120 into which has been input the analog input signal on which gain control has been performed in accordance with the detection results by the first detection portion 140 and the second detection portion 150.

Then, the performance monitoring/selection signal generating portion 160 compares the results of performing AD conversion on the analog input signals that have been gain controlled in accordance with the three types of detection results, and generates and outputs the selection signal to select the wave detection with a preferable AD conversion result. More specifically, the S/N ratios for the analog input signals that have been gain controlled in accordance with the three types of detection results are compared, and the selection signal is generated and output to select the wave detection with the preferable result.

For example, when the AD conversion result for the analog input signal that has been gain controlled in accordance with the detection result of the first detection portion 140 is preferable, the performance monitoring/selection signal generating portion 160 generates and outputs a selection signal to switch on the switch S1 and switch off the switch S2.

Further, when the AD conversion result for the analog input signal that has been gain controlled in accordance with the detection result of the second detection portion 150 is preferable, the performance monitoring/selection signal generating portion 160 generates and outputs a selection signal to switch off the switch S1 and switch on the switch S2.

Then, when the AD conversion result for the analog input signal that has been gain controlled in accordance with the detection results of the first detection portion 140 and the second detection portion 150 is preferable, the performance monitoring/selection signal generating portion 160 generates and outputs a selection signal to switch on both the switch S1 and the switch S2.

In this manner, by comparing the results of AD conversion on the analog input signals that have been gain controlled in accordance with the types of detection results and selecting the wave detection for which the AD conversion result is preferable, the AD converter 100 shown in FIG. 9 can achieve more favorable AD conversion processing.

It should be noted that verification of the AD conversion performance by the performance monitoring/selection signal generating portion 160 may be performed only once when the AD converter 100 is activated, or may be performed at regular intervals.

3. CONCLUSION

According to the embodiment of the present disclosure as described above, the AD converter is provided that can use the detection portion 140 to compare the difference between the reference voltages VOH and VOL of the AD converter circuit 120 with the amplitude of the analog input signal that is amplified by the AGC circuit 110 and can change the amplification factor of the AGC circuit 110 in accordance with the comparison results.

The detection portion 140 compares the difference between the reference voltages VOH and VOL of the AD converter circuit 120 with the amplitude of the analog input signal that is amplified by the AGC circuit 110, and if the amplitude of the analog input signal exceeds the difference between the reference voltages VOH and VOL, the detection portion 140 generates the pulse in the high state during the period of time that the amplitude of the analog input signal exceeds the difference between the reference voltages VOH and VOL. Then, based on the pulse, the detection portion 140 generates the gain control signal GCNT that changes the amplification factor of the AGC circuit 110, and outputs the gain control signal GCNT to the AGC circuit 110.

In this way, the amplitude of the analog input signal that is amplified by the AGC circuit 110 can automatically be matched with the difference between the reference voltages VOH and VOL of the AD converter circuit 120. The convergence time of the analog input amplitude can be reduced and the assumed quantization resolution of the AD converter circuit can be utilized to the maximum extent.

In addition, the AD converter 100 according to the embodiment of the present disclosure can use the reference voltage variable level generating circuit 130 to manually change the reference voltages VOH and VOL of the AD converter circuit 120. In this way, for example, if a strength of the analog input signal is weak, and noise is included in amplification even when amplifying by the AGC circuit 110 and effective AD conversion cannot be performed, the dynamic range of the analog input signal can be matched to the reference voltages by changing the reference voltages VOH and VOL of the AD converter circuit 120 using the reference voltage variable level generating circuit 130.

The exemplary embodiments of the present disclosure are described in detail above with reference to the accompanying drawings. However, the present disclosure is not limited to the examples described above. It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2010-187371 filed in the Japan Patent Office on Aug. 24, 2010, the entire content of which is hereby incorporated by reference.

What is claimed is:

1. An AD converter comprising:
    an auto gain control ("AGC") circuit that changes an input amplitude of an analog signal and outputs the analog signal to an AD converter circuit that converts the analog signal to a digital signal; and
    a first detection portion that compares an output range of the analog signal output by the AGC circuit with a predetermined voltage range and, based on a comparison result, controls the output range of the analog signal output of the AGC circuit,
    wherein the first detection portion compares the output range of the analog signal output of the AGC circuit with reference voltages of the AD converter circuit and, based on a comparison result, controls the output range of the analog signal output of the AGC circuit, and
    wherein, during a period of time in which the output range of the analog signal output of the AGC circuit exceeds a range of the reference voltages, the first detection portion outputs a signal that indicates that the output of the AGC circuit exceeds the range of the reference voltages of the AD converter circuit.

2. The AD converter according to claim 1, wherein the signal output by the first detection portion is a pulse.

3. The AD converter according to claim 1, further comprising:
   a second detection portion that, from the output of the AGC circuit, controls the output range of the analog signal output by the AGC circuit such that the output range of the analog signal is a selected range.

4. The AD converter according to claim 3, further comprising:
   a performance comparison portion that compares an AD conversion performance of the AD converter circuit obtained using the first detection portion with an AD conversion performance of the AD converter circuit obtained using the second detection portion,
   wherein, of wave detection by the first detection portion and wave detection by the second detection portion, the performance comparison portion selects the wave detection for which the AD conversion performance of the AD converter circuit is superior.

5. The AD converter according to claim 3, further comprising:
   a performance comparison portion that compares an AD conversion performance of the AD converter circuit obtained using the first detection portion, an AD conversion performance of the AD converter circuit obtained using the second detection portion, and an AD conversion performance of the AD converter circuit obtained using the first detection portion and the second detection portion,
   wherein, of wave detection by the first detection portion, wave detection by the second detection portion and wave detection by the first detection portion and the second detection portion, the performance comparison portion selects the wave detection for which the AD conversion performance of the AD converter circuit is superior.

6. The AD converter according to claim 1, further comprising:
   a reference voltage adjustment portion that changes the reference voltages of the AD converter circuit.

7. The AD converter according to claim 1, wherein the AD converter circuit is a flash AD converter circuit.

8. An AD converter circuit voltage control method, comprising:
   performing gain control via an auto gain control ("AGC") circuit, by changing an input amplitude of an analog signal and outputting the analog signal to an AD converter circuit that converts the analog signal to a digital signal;
   performing wave detection, by comparing an output range of the analog signal output in performing the gain control with a predetermined voltage range and, based on a comparison result, controlling the output range of the analog signal output in performing the gain control;
   comparing the output range of the analog signal output of the AGC circuit with reference voltages of the AD converter circuit and, based on a comparison result, controlling the output range of the analog signal output; and
   during a period of time in which the output range of the analog signal output of the AGC circuit exceeds a range of the reference voltages, outputting a signal that indicates that the analog signal output exceeds the range of the reference voltages of the AD converter circuit.

* * * * *